(12) United States Patent
Gouraud et al.

(10) Patent No.: US 11,171,034 B2
(45) Date of Patent: Nov. 9, 2021

(54) MANUFACTURING OF CAVITIES

(71) Applicant: STMicroelectronics (Crolles 2) SAS, Crolles (FR)

(72) Inventors: Pascal Gouraud, Montbonnot St. Martin (FR); Delia Ristoiu, St. Ismier (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/707,614

(22) Filed: Dec. 9, 2019

(65) Prior Publication Data

US 2020/0203211 A1    Jun. 25, 2020

(30) Foreign Application Priority Data

Dec. 21, 2018 (FR) ...................................... 1873756

(51) Int. Cl.
*H01L 21/00* (2006.01)
*H01L 21/762* (2006.01)
*H01L 29/06* (2006.01)

(52) U.S. Cl.
CPC ...... *H01L 21/7621* (2013.01); *H01L 29/0649* (2013.01)

(58) Field of Classification Search
CPC .................. H01L 21/7621; H01L 29/0649
See application file for complete search history.

(56) References Cited

U.S. PATENT DOCUMENTS

| 5,462,767 | A | * | 10/1995 | Yamazaki | ............. C23C 16/045 216/18 |
| 5,692,281 | A | * | 12/1997 | Rajeevakumar | ........................... H01L 27/10832 257/E21.651 |
| 2002/0031890 | A1 | | 3/2002 | Watanabe et al. | |
| 2003/0173641 | A1 | | 9/2003 | Ohta et al. | |

FOREIGN PATENT DOCUMENTS

EP    2743976 A1    6/2014

OTHER PUBLICATIONS

INPI Search Report and Written Opinion for FR 1873756 dated Nov. 4, 2019 (9 pages).

* cited by examiner

*Primary Examiner* — Richard A Booth
(74) *Attorney, Agent, or Firm* — Crowe & Dunlevy

(57) ABSTRACT

A substrate includes a first solid semiconductor region and a second semiconductor on insulator region. First and second cavities are simultaneously formed in the first and second regions, respectively, of the substrate using etching processes in two steps which form an upper portion and a lower portion of each cavity. The first and second cavities will each have a step at a level of an upper surface of the insulator of the second semiconductor on insulator region. A further oxidation of the first cavity produces a rounded or cut-off area for the upper portion.

24 Claims, 4 Drawing Sheets

MANUFACTURING OF CAVITIES

PRIORITY CLAIM

This application claims the priority benefit of French Application for Patent No. 1873756, filed on Dec. 21, 2018, the content of which is hereby incorporated by reference in its entirety to the maximum extent allowable by law.

TECHNICAL FIELD

The present disclosure generally concerns the manufacturing of electronic components for integrated circuits, and more particularly the manufacturing of cavities.

BACKGROUND

The manufacturing of cavities is a usual step of electronic device (integrated circuit) manufacturing methods. For example, such cavities are used to manufacture insulating trenches in a substrate which may insulate between different electronic circuit components.

SUMMARY

An embodiment provides a method of manufacturing cavities comprising a step of simultaneously forming a first cavity in a first solid semiconductor region of a substrate and a second cavity in a second semiconductor on insulator region of the substrate, the first and second cavities comprising a step at the level of the upper surface of the insulator.

According to an embodiment, the method comprises a first step of simultaneously forming first portions of the first and second cavities, the first portion of the second cavity reaching the upper surface of the insulator.

According to an embodiment, the forming of the first portions comprises an etch step having substantially the same duration for the first portions of the first and second cavities.

According to an embodiment, the first portions of the first and second cavities have substantially the same depth.

According to an embodiment, the method comprises forming an insulating layer on the walls and the bottom of the first portions of the first and second cavities.

According to an embodiment, the method comprises a step of forming second portions of the first and second cavities, the second portions being formed in the bottom of the first portions.

According to an embodiment, the portions of the insulating layer located on the walls of the first portions are not removed on etching of the second portions.

According to an embodiment, the surface area of the openings of the second portions is smaller than the surface area of the opening of the second portions.

According to an embodiment, the method comprises forming, on the walls and the bottom of the first and second cavities, an insulating layer by oxidation of the substrate.

According to an embodiment, the method comprises softening the step of the first cavity, so that the walls of the first cavity comprise two portions having different slopes.

Another embodiment provides an electronic device comprising a first cavity in a first solid semiconductor region of a substrate and a second cavity in a second semiconductor on insulator region of the substrate, the walls of the first cavity comprising lower and upper portions, the upper portion having the shape of a cut-off corner or a rounded shape.

According to an embodiment, the radius of curvature of the rounded shape of the upper portion is greater than the radius of curvature of the edge of the second cavity.

According to an embodiment, the radius of curvature of the rounded shape of the upper portion is greater by 50% than the radius of curvature of the edge of the second cavity.

According to an embodiment, the radius of curvature of the rounded shape of the upper portion is greater than 15 nm and the radius of curvature of the edge of the second cavity is smaller than 10 nm.

According to an embodiment, the points of contact between the upper portion forming a cut-off corner and the lower portion of the walls of the first cavity are substantially at the same level as the insulator of the second region.

According to an embodiment, the slope difference between the upper portion forming a cut-off corner and the lower portion is in the range from approximately 45° to approximately 70°.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
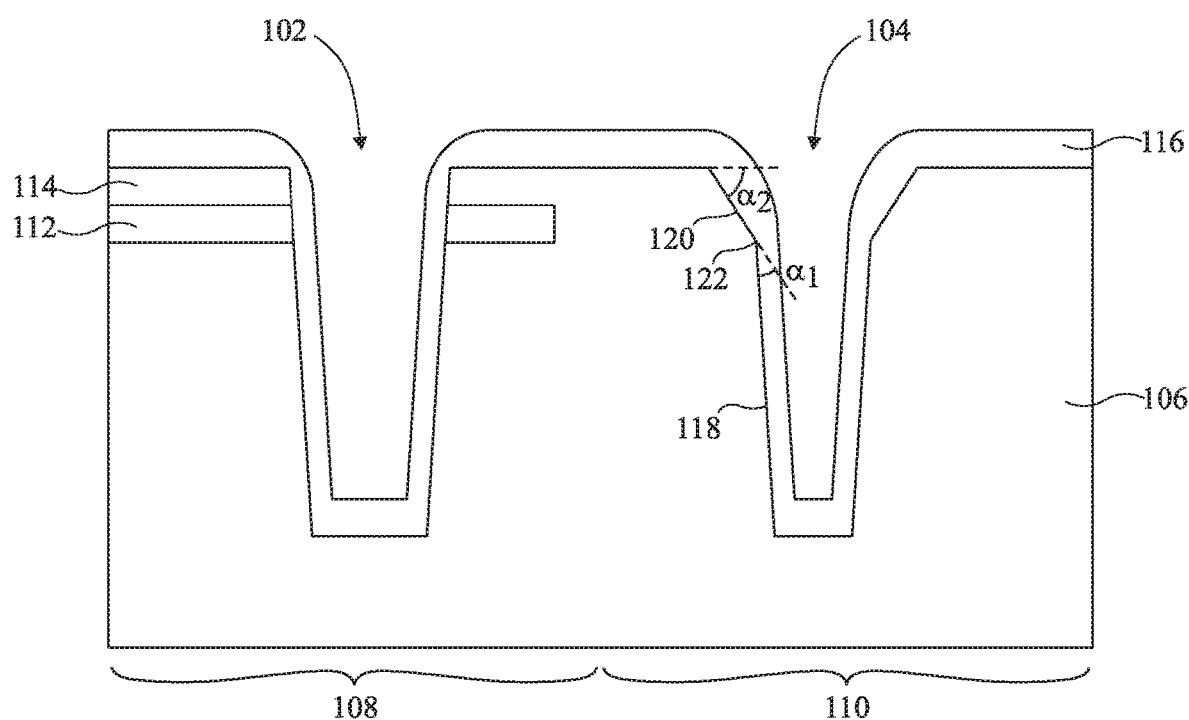
FIG. 1 shows an embodiment of an electronic device comprising cavities.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", "approximately", and "in the order of" are used herein to designate a tolerance of plus or minus 10%, preferably of plus or minus 5%, of the value in question.

FIG. 1 shows an embodiment of an electronic device comprising cavities 102 and 104.

The device comprises a semiconductor substrate 106, for example, made of silicon. Substrate 106 comprises a first region 108 and a second region 110. Cavity 102 is located in region 108 and cavity 104 is located in region 110.

Region 108 is a region of semiconductor-on-insulator type, comprising an insulating layer 112 separating a semiconductor layer 114, generally monocrystalline, from the underlying substrate 106. Layer 114 for example has a thickness in the range from approximately 10 to approximately 15 nm. Region 110 is a solid semiconductor region. Regions 108 and 110 are shown in FIG. 1 as being adjacent. In practice, regions 108 and 110, while still being part of the substrate 106, may be at different locations and may be separated by other regions and various components.

An insulating layer 116, for example, made of an oxide, preferably of silicon oxide, covers the upper surface of substrate 106, including the upper surface of layer 114, as well as the walls and the bottom of cavities 102 and 104. Insulating layer 116 is preferably formed by oxidation.

The thickness of insulating layer 116 may be sufficient to at least partially fill cavities 102 and 104, thus forming insulating trenches.

The walls of cavity 102 have a substantially constant slope, for example greater than approximately 85° relative to the horizontal direction. Further, the edge of cavity 102, that is, the points forming the separation between the walls of cavity 102 and the upper surface of semiconductor layer 114, for example, has a protruding shape. The angle between the walls of cavity 102 and the upper surface of semiconductor layer 114 is preferably in the range from 90° to 95°. The edge of cavity 102 may also have a rounded shape having a radius of curvature smaller than 10 nm.

The walls of cavity 104 comprise a lower portion 118 and an upper portion 120. Upper portion 120 forms the connection between lower portion 118 of cavity 104 and the upper surface of the substrate. Upper portion 120 may form a cut-off corner or have a rounded shape. In the case where the upper portion has a rounded shape, the radius of curvature is, for example, greater than 10 nm, preferably greater than 15 nm. The radius of curvature of upper portion 120 is thus greater than the radius of curvature of the edge of cavity 102, for example, 50% greater. In the case where upper portion 120 forms a cut-off corner, points 122 form the separation between portions 118 and 120. Points 122 are substantially at the level of insulating layer 112. Difference α2 between upper portion 120 and the upper surface of substrate 106 is, for example, between approximately 45° and approximately 70°, preferably between 45° and 70°. Similarly, the slope difference α1 between the slope of portion 118 and the slope of portion 120 is in the range from approximately 15° to approximately 45°, preferably from 15° to 45°. In practice, the transition between the walls of cavity 104 and the upper surface of substrate 106 is substantially rounded. The slope of lower portion 118 is, for example, greater than approximately 85° relative to the horizontal direction.

The portion of insulating layer 116 located on the edge of cavity 102 is thinner than the rest of layer 116. Indeed, the larger an angle, the less rapidly and easily the oxide grows.

The thickness difference at the edge of cavity 102 may weaken the insulation which is desired to be formed and, for example, may cause short-circuits and a decrease in the reliability of the device.

The angles of cavity 104, that is, the angle between portions 118 and 120 and the angle between portion 120 and the upper surface of the substrate, are smaller than the angles of cavity 102, in particular the angle between the slope of cavity 102 and the upper surface of layer 114. The thickness difference between the portions of insulating layer 116 located on the angles of cavity 104 and the portions of layer 116 located on the upper surface of substrate 106 is smaller than the thickness difference between the portions of layer 116 located on the edge of cavity 102 and the portions of insulating layer 116 located on the walls of cavity 102. The portions of insulating layer 116 located on the angles of cavity 104, for example, have substantially the same thickness as the portions of layer 116 located on the upper surface of substrate 106.

Cavities such as cavity 104 are preferably used in high-voltage components, that is, components which have to be able to receive a high voltage, for example, a voltage greater than 5 V. Indeed, the substantially constant thickness of insulating layer 116 provides a better insulation than a variable thickness, for example, in a case where the thickness at the level of an angle would be smaller than in the rest of the layer. Such a thickness difference would strongly risk occurring in the case where a cavity, for example having a constant slope, would be formed in a solid substrate by a single etching.

Cavities 102 are preferably used in components or elements where the control of their critical elements is important and thus where an edge such as that of cavity 104 might cause a variability issue.

FIGS. 2A-B, 3A-3B and 4A-4B show steps of an embodiment of a method of manufacturing the cavities of FIG. 1.

Figure 2A:
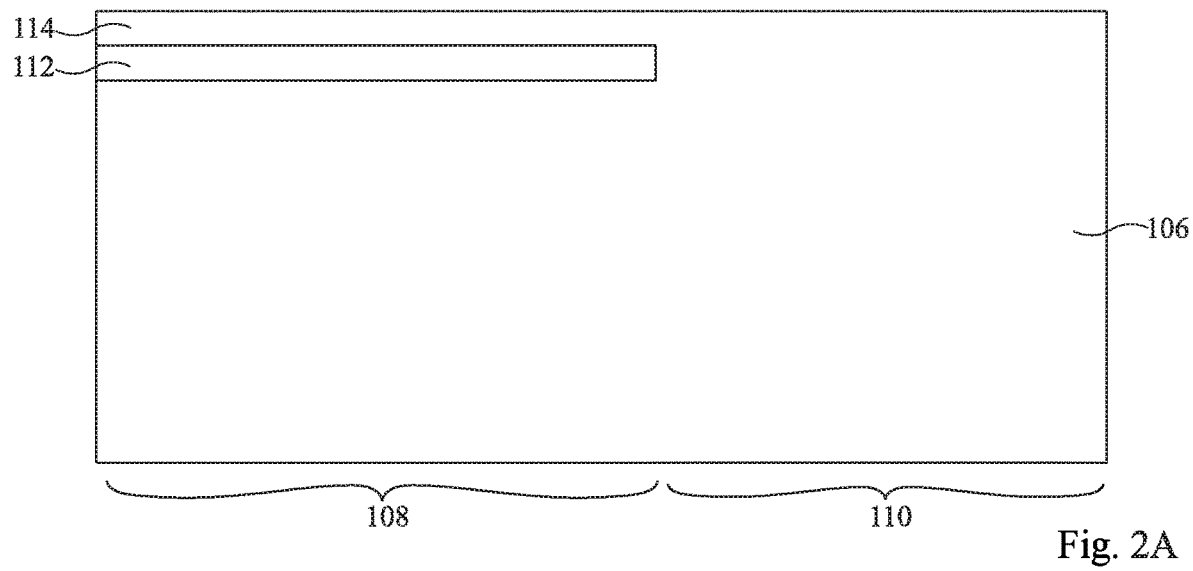
FIGS. 2A-2B, 3A-3B and 4A-4B show steps of an embodiment of a method of manufacturing the cavities of FIG. 1.
Figure 2B:
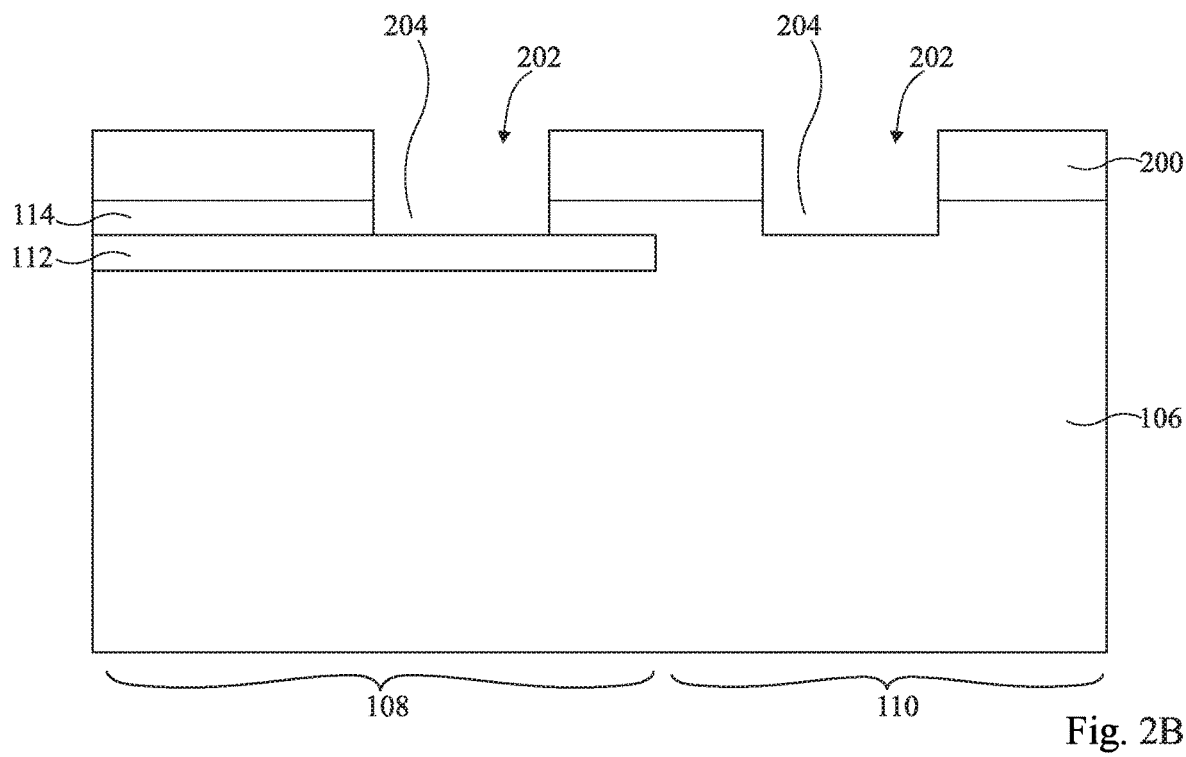

In FIG. 2A, a substrate of semiconductor-on-insulator type comprises, above a substrate 106, an insulating layer 112 covered with a semiconductor layer 114. A region 110 is formed which does not comprise insulating layer 112 and a region 108 is formed where insulating layer 112 is kept. The forming of region 110 comprises etching layers 112 and 114 in region 110 and then growing by epitaxy the material of substrate 106 up to substantially the height of the upper surface of layer 114.

In Figured 2B, a mask 200 is formed on the upper surface of the structure. Mask 200 comprises openings 202 vertically in line with the location of the cavities to be formed. An etch step is then carried out to form a first portion 204 of each cavity 102 and 104. The etch step is carried out simultaneously in region 108 and in region 110. The etching lasts for substantially the same time in regions 108 and 110, preferably exactly the same time, and is carried on until layer 112 is reached in region 108. The first portions 204 of cavities 102 and 104 thus have substantially the same depth. The etching is, for example, a non-selective etching of the semiconductor material of layer 114 and of substrate 106.

Figure 3A:
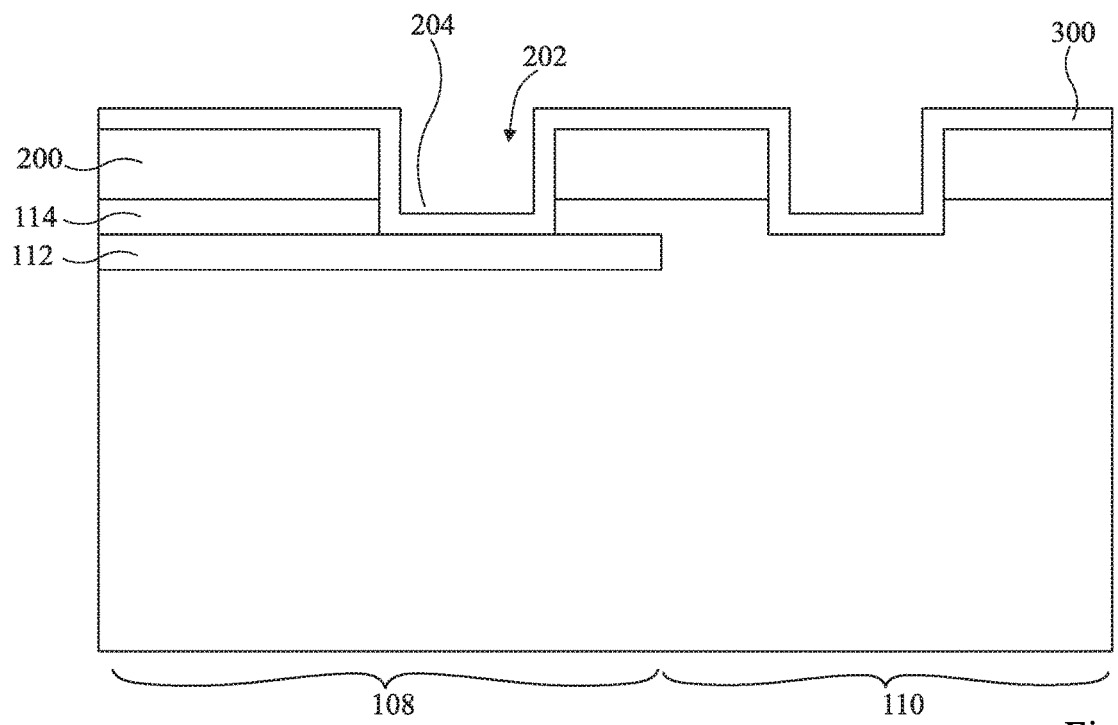

In FIG. 3A, an insulating layer 300 is formed covering mask 200, the walls of openings 202, the walls and the bottom of the first portions 204 of cavities 102 and 104. The thickness of layer 300 is for example in the range from 5 nm to 20 nm.

Figure 3B:
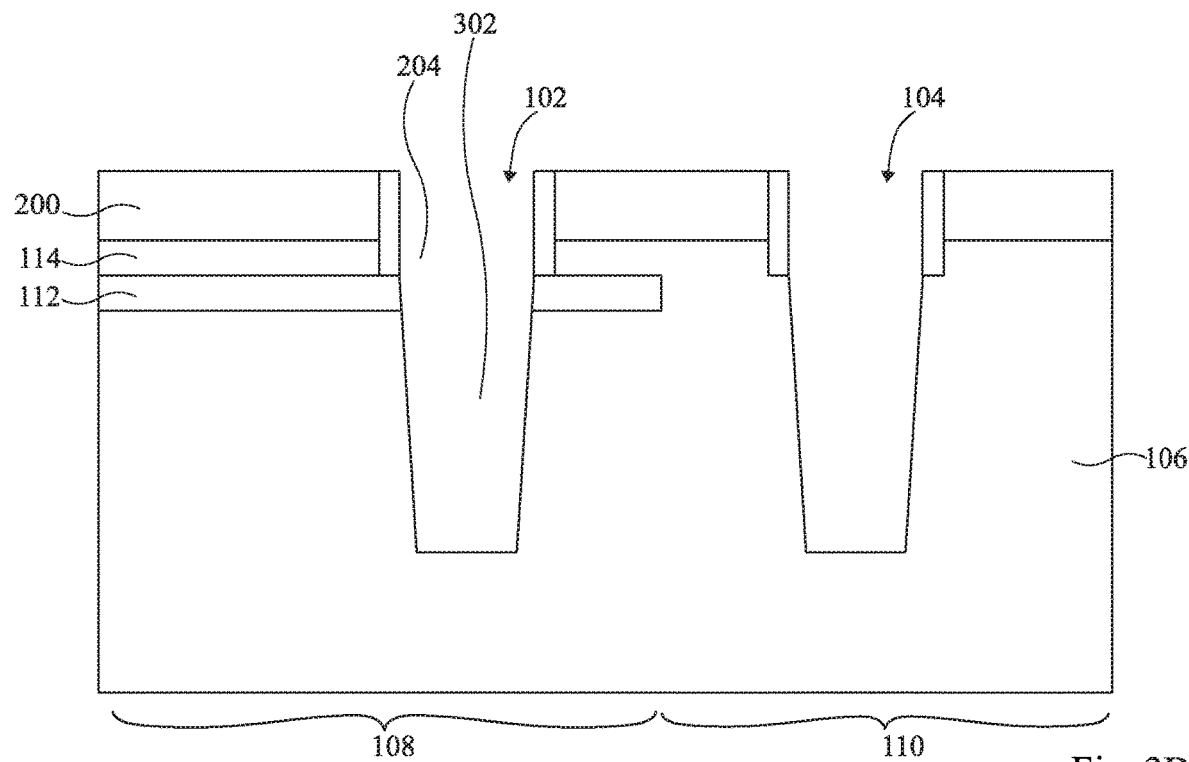

In FIG. 3B, etching of second portions 302 of cavities 102 and 104 is performed. The etching is anisotropic and etches the bottom of the first portions 204 of cavities 102 and 104. The second portion 302 of cavity 102 thus crosses insulating layer 300 and insulating layer 112, and extends in the rest of substrate 106. The second portion 302 of cavity 104 crosses insulating layer 300 and extends in substrate 106. The portions of insulating layer 300 located on the upper surface of mask 200 are also etched.

The portions of insulating layer 300 located on the walls of mask 200 and of the first portions 204 of cavities 102 and 104 are not etched during this step. Thus, the surface area of the opening of each second portion 302 is smaller than the surface area of the opening in silicon of the first portion 204 of the same cavity.

Figure 4A:
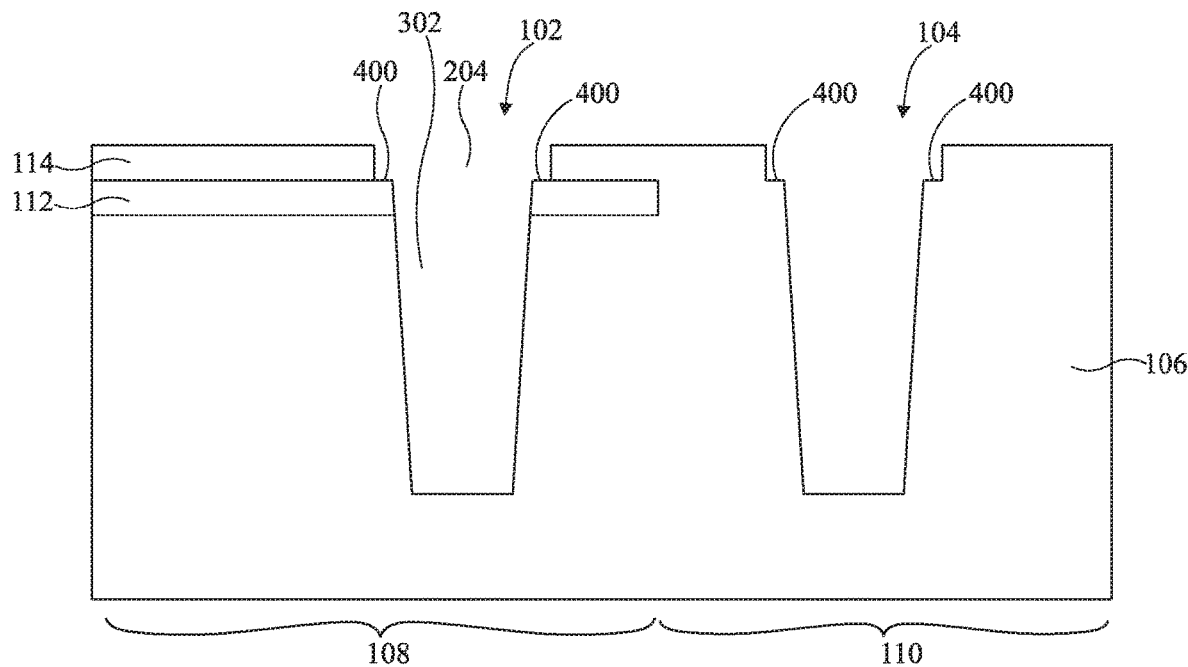

In FIG. 4A, the mask 200 and insulating layer 300 are removed. Cavities 102 and 104 thus comprise steps, or shoulders, 400 forming the separation between the first portion 204 and the second portion 302 of each cavity.

The steps are located, in region 110, substantially at the same level as the upper surface of insulating layer 112 and are formed, in region 108, on insulating layer 112. The width of the steps is for example substantially equal to the thickness of insulating layer 300. Thus, the width of the steps is for example in the range from 5 nm to 20 nm.

Figure 4B:
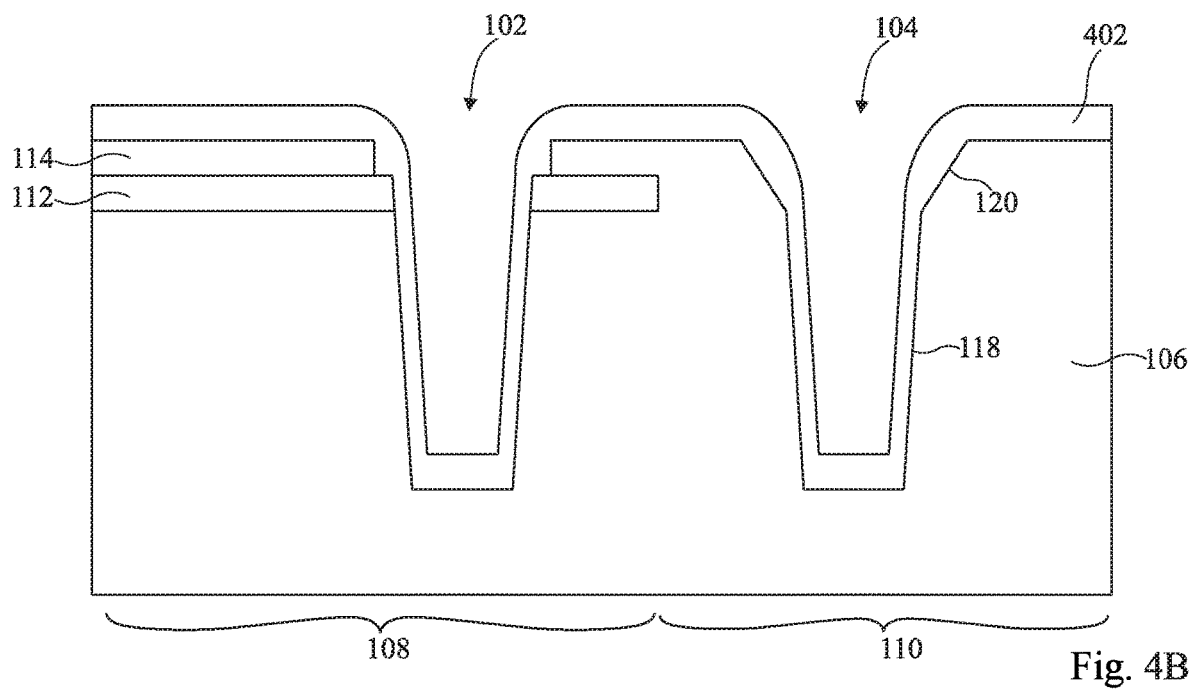

In FIG. 4B, an insulating layer 402 is formed on the structure, that is, on the walls and the bottom of cavities 102 and 104 and on the upper surface of layer 114 and of substrate 106. Layer 402 is formed by oxidation of the semiconductor material of layer 114 and of substrate 106. The oxidation of the semiconductor material at the level of step 400 of cavity 104 causes a softening or an erosion of the step and of the step region and the forming of upper portion 120. Upper portion 120 may form a cut-off corner or may have a rounded shape, as described in relation with FIG. 1.

In region 108, insulating layer 112 does not react during the oxidation step, and there thus is no softening or erosion. Thus, the edge of the cavity has a shape comprising an acute angle or a rounded shape having an angle of curvature smaller than 10 nm.

A step of oxide deposition (not explicitly shown) may complete the oxidation step to fill cavities 102 and 104.

An advantage of the described embodiments is that they enable to simultaneously manufacture insulating trenches for high-voltage components having a more reliable insulation and insulating trenches for components having critical dimensions.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing cavities, comprising:
simultaneously forming a first cavity in a first solid semiconductor region of a substrate and a second cavity in a second semiconductor on insulator region of the substrate, wherein the first cavity and the second cavity each comprise a sidewall, wherein the sidewalls of the first cavity and second cavity each include a step at a level of an upper surface of an insulator layer of the semiconductor on insulator region.

2. The method of claim 1, wherein simultaneously forming comprises forming first portions of the first and second cavities, wherein the first portion of the second cavity reaches the upper surface of the insulator layer.

3. The method of claim 2, wherein forming first portions comprises etching with a substantially same duration to form the first portions of the first and second cavities.

4. The method of claim 2, wherein the first portions of the first and second cavities have substantially a same depth.

5. The method of claim 2, further comprising forming an insulating layer on walls and a bottom of the first portions of the first and second cavities.

6. The method of claim 5, further comprising forming second portions of the first and second cavities, the second portions being formed in the bottom of the first portions by removing the insulating layer on the bottoms of the first portions of the first and second cavities.

7. The method of claim 6, wherein the insulating layer located on the walls of the first portions of the first and second cavities are not removed when forming the second portions.

8. The method of claim 6, wherein a surface area of openings for the second portions is smaller than a surface area of openings for the first portions.

9. The method of claim 1, further comprising oxidizing the substrate to form, on sidewalls and bottoms of the first and second cavities, an insulating layer by oxidation of the substrate.

10. The method of claim 9, wherein oxidizing forms a change in slope of the sidewall of the first cavity at a location corresponding to the insulator layer of the semiconductor on insulator region.

11. The method of claim 1, further comprising softening the step of the first cavity, in such a way that the walls of the first cavity comprise two portions having different slopes, wherein a change in slope occurs at a depth in the substrate corresponding to the depth of the insulator layer of the semiconductor on insulator region.

12. A method for forming insulated trenches in a substrate, wherein the substrate includes a first region including a semiconductor substrate, an insulating layer over the semiconductor substrate and a semiconductor layer and further includes a second region including the semiconductor substrate having a top surface coplanar with a top surface of the semiconductor layer, the method comprising:
performing a first etch to open a first trench in the first region and a second trench in the second region, the first and second trenches having a depth at a level of a top surface of the insulating layer;
lining sidewalls and bottoms of the first and second trenches with an insulating liner;
with the insulating liner remaining on the sidewalls, performing a second etch to remove the insulating liner from the bottom of the first and second trenches and extend the first and second trenches to a depth below a level of a bottom surface of the insulating layer;
removing the insulating liner from the sidewalls of the first and second trenches to produce a shoulder in the first and second trenches at a level of the top surface of the insulating layer;
oxidizing the semiconductor substrate and semiconductor layer at the first trench to form an insulating layer covering sidewalls and bottom of the first trench; and
oxidizing the semiconductor substrate at the second trench to form an insulating layer covering sidewalls and bottom of the second trench.

13. The method of claim 12, wherein the depth of the extended first and second trenches is substantially the same.

14. The method of claim 12, wherein oxidizing the semiconductor layer at the first trench forms a rounded corner at an upper edge of the first trench.

15. The method of claim 12, wherein oxidizing the semiconductor substrate at the second trench forms a first rounded corner at an upper edge of the second trench and a second rounded corner in the second trench at a level of the insulating layer.

16. The method of claim 15, wherein the sidewall of the second trench between the first and second rounded corners has a first slope relative to an upper surface of the semiconductor substrate and wherein the sidewall of the second trench below the second rounded corner has a second slope relative to the upper surface of the semiconductor substrate, said second slope being greater than the first slope.

17. A method of manufacturing a cavity in a solid semiconductor substrate, comprising:
    forming a first portion of the cavity, wherein the first portion extends to a first depth in the solid semiconductor substrate;
    forming an insulating layer on walls and a bottom of the first portion of the cavity;
    forming a second portion of the cavity, wherein the second portion extends from the bottom of the first portion by removing the insulating layer at the bottom of the first portion and extending the second portion to a second depth in the solid semiconductor substrate;
    wherein the insulating layer at the walls of the first portion is not removed when forming the second portion;
    removing the insulating layer at the walls of the first portion following formation of the second portion to form a step in a sidewall of the cavity; and
    oxidizing the solid semiconductor substrate to form, on the sidewall, at the step and at the bottom of the cavity, an insulating layer.

18. The method of claim 17, wherein oxidizing forms a change in slope of the sidewall of the first portion at a location corresponding to the step.

19. The method of claim 17, wherein oxidizing comprises softening the step such that the sidewall of the cavity comprises two portions having different slopes, wherein a change in slope occurs at a depth in the substrate corresponding to a depth of the step.

20. The method of claim 17, wherein the solid semiconductor substrate is positioned adjacent to a silicon on insulator portion, and wherein the step is located at a level of an insulating layer of the silicon on insulator portion.

21. A method for forming an insulated trench in a semiconductor substrate, the method comprising:
    performing a first etch to open a trench having a first depth;
    lining sidewalls and a bottom of the trench with an insulating liner;
    with the insulating liner remaining on the sidewalls, performing a second etch to remove the insulating liner from the bottom of the trench and extend the trench to a second depth;
    removing the insulating liner from the sidewalls of the trench to produce a shoulder in the trench at a level of the first depth; and
    oxidizing the semiconductor substrate at the trench to form an insulating layer covering sidewalls, the shoulder and a bottom of the trench.

22. The method of claim 21, wherein oxidizing the semiconductor substrate forms a first rounded corner at an upper edge of the trench and a second rounded corner in the trench at a level of the first depth.

23. The method of claim 22, wherein the sidewall of the second trench between the first and second rounded corners has a first slope relative to an upper surface of the semiconductor substrate and wherein the sidewall of the second trench below the second rounded corner has a second slope relative to the upper surface of the semiconductor substrate, said second slope being greater than the first slope.

24. The method of claim 21, wherein the semiconductor substrate is positioned adjacent to a silicon on insulator substrate portion, and wherein the shoulder is located at a level of an insulating layer of the silicon on insulator substrate portion.

* * * * *